United States Patent
Bergstedt

[19]

[11] Patent Number: 6,108,205
[45] Date of Patent: Aug. 22, 2000

[54] MEANS AND METHOD FOR MOUNTING ELECTRONICS

[75] Inventor: Leif R. Bergstedt, Sjömarken, Sweden

[73] Assignee: Telefonaktiebolaget LM Ericsson, Stockholm, Sweden

[21] Appl. No.: 08/953,916

[22] Filed: Oct. 20, 1997

[30] Foreign Application Priority Data

Oct. 21, 1996 [SE] Sweden .................................. 9603863

[51] Int. Cl.[7] .................................................. H05K 7/20
[52] U.S. Cl. ......................... 361/704; 361/705; 361/706; 361/707; 361/709; 251/706; 251/707; 251/712; 251/713; 174/51
[58] Field of Search .................................. 361/704, 705, 361/706, 707, 708, 709, 710, 711–719, 760–762; 257/705–707, 713, 717, 719, 796; 174/16.1, 16.3, 51, 52.1, 52.2, 52.4

[56] References Cited

U.S. PATENT DOCUMENTS

| | | | |
|---|---|---|---|
| 4,857,387 | 8/1989 | Eberhardt et al. | 428/209 |
| 5,050,040 | 9/1991 | Gondusky et al. | 361/708 |
| 5,080,958 | 1/1992 | Patterson et al. | 428/209 |
| 5,172,301 | 12/1992 | Schneider | 361/386 |
| 5,181,025 | 1/1993 | Ferguson et al. | 340/870.21 |
| 5,204,416 | 4/1993 | Mercer et al. | 525/390 |
| 5,245,510 | 9/1993 | Honda | 361/718 |
| 5,287,247 | 2/1994 | Smits et al. | 361/707 |
| 5,360,942 | 11/1994 | Hoffman et al. | 174/52.4 |
| 5,412,247 | 5/1995 | Martin | 257/678 |
| 5,459,639 | 10/1995 | Izumi | 361/707 |
| 5,578,796 | 11/1996 | Bhat et al. | 361/761 |
| 5,687,062 | 11/1997 | Larson | 361/706 |
| 5,789,805 | 8/1998 | Kanekawa et al. | 257/676 |

FOREIGN PATENT DOCUMENTS

| | | |
|---|---|---|
| 0044247A1 | 1/1982 | European Pat. Off. . |
| 0160418A2 | 11/1985 | European Pat. Off. . |
| 0160439A2 | 11/1985 | European Pat. Off. . |
| 0267862A1 | 5/1988 | European Pat. Off. . |
| 0320660A2 | 6/1989 | European Pat. Off. . |
| 6-61358 | 3/1994 | Japan . |
| 6-344500 | 12/1994 | Japan . |
| 6-344501 | 12/1994 | Japan . |
| 2097998A | 11/1982 | United Kingdom . |
| 2162124A | 1/1986 | United Kingdom . |

OTHER PUBLICATIONS

International–Type Search Report—corresponding to Application No. SE 9603863–3, mailed Jul. 4, 1997.

*Primary Examiner*—Leo P. Picard
*Assistant Examiner*—Boris L. Chervinsky
*Attorney, Agent, or Firm*—Burns, Doane, Swecker & Mathis, L.L.P.

[57] ABSTRACT

The present invention relates to a method and device for making a temperature-compensated bedding for chips on printed boards, at which a temperature-compensated device is totally or partly recessed in a carrier in the printed board. The chips is placed over the temperature-compensated device.

The temperature-compensated device includes a piece of metal recessed in the carrier under the chip. A layer of copper is fixed against the upper side of the carrier and the upper side of the metal piece. The thickness of the copper layer and the thickness of the metal piece are dimensioned so that the resulting coefficient of linear expansion at the upper side of the copper layer is equally big as or a bit bigger than the coefficient of linear expansion of the chip.

The temperature-compensated device can as an alternative to the above include a module recessed in the carrier under the chip. A thin layer of dielectric is fixed against the carrier, so that the coefficient of linear expansion of the dielectric layer don't appreciable affect the resulting coefficient of linear expansion of the temperature-compensated device.

12 Claims, 7 Drawing Sheets

MEANS AND METHOD FOR MOUNTING ELECTRONICS

TECHNICAL FIELD

The present invention relates to a device and a method for creating a temperature-compensating bedding for electronics on a printed board.

STATE OF THE ART

A printed board is, according to the state of the art, a board made from several layers of suitable material. The bottom layer is, for example, called carrier and may consist of brass or FR4 epoxy glass. On the carrier, the remaining layers are arranged, such as for example one or more pattern layers, which are made from a suitable electrically conductive material, e.g. copper.

Among others, three different known processes for manufacturing of printed boards are used: plating, contour milling and etching.

Plating refers to the process of platting one layer of the printed board with a suitable electrical conducting substance, e.g. copper.

Contour milling refers to the process of milling desired contours, e.g. recesses and contact pads, on the printed board. Electronic components, e.g. chips, can be connected to the contact pads on the printed board.

Etching refers to the process of etching undesired plated parts of a layer on the printed board, whereby a desired conductive pattern emerges from the layer. The etched conductive pattern may be electrical connections between contact pads on the printed board, said connections also being called conductors.

The plated details in the printed board may in certain cases be surface-treated with a suitable compound, e.g. nickel or gold, to protect the details from corrosion and to create solderable surfaces.

The printed board is used as a carrier to hold electronic components in place and the printed board comprises the above mentioned conductors electrically interconnecting these components as desired. Examples of components may be chips, amplifiers, transformers, resistors, capacitors and inductors.

The contact pads on the printed board are used for connecting the components with the conductors on the printed board, and the printed board comprises terminals by which external components can be connected to the printed board and thereby further with desired components on the printed board.

Printed boards can be manufactured with several pattern layers (multilayer) called multilayer boards. The multilayer boards consist of metal layers, called pattern layers, e.g. of copper, being separated from each other by isolating layers of dielectrica, e.g. of PTFE (PolyTetraFluoroEthylene). The metal layers are electrically interconnected via plated through-holes, called vias, extending between the layers to be interconnected.

The isolating layers isolate the metal layers from each other to prevent them from short-circuiting during etching of the metal layers. A laminating foil between the metal layers and the isolating layers attaches these to each other, whereby they do not slide over one another. The laminating foil may, for example, consist of a PFA-compound (PerFluoroAlcoxy).

A chip is an electronic circuit placed on an intended contact surface on the printed board. The chip comprises connections connecting the chip to the contact surface. The connections may, for example, consist of bonding surfaces, called bond pads, or of elevations on the chip.

The chip is connected to conductors on the pattern layer by wires, i.e. bond wires, of e.g. aluminium. The bond wires are connected between the bonding surfaces of the chip and the conductors of the printed board.

In case the chip is a so-called flip-chip comprising elevations, i.e. "bumps", within the bonding surfaces of the flip-chip, the flip-chip is placed with its elevations right on the pattern layer conductors.

An MCM-module (Multi-Chip-Module) comprises a number of chips, e.g. five to six chips. One or several MCM-modules may be integrated onto a larger printed board, the so-called mother board. The MCM-module may be encased in a housing comprising cuts located over the chip connections.

Chips in general are sensitive to thermal expansion of the bedding, said thermal expansion arising in the chip and the bedding during temperature variation.

Temperature variations arise, for example, as a current circulating in the circuits on the printed board causes heating of the circuits. This heats the circuits, and heat is transferred to the circuit bedding as well.

In general, the coefficient of thermal expansion for the chip and the bedding are different, whereby the chip and the bedding expand differently as the temperature varies, leading to great tensions being generated in the chip, subsequently liable to break.

A chip placed directly on a carrier, having a coefficient of thermal expansion different from the coefficient of thermal expansion of the chip, in a printed board cracks particularly easily during a cold start when the current is switched on through the chip and heat is dissipated within the chip.

To prevent chips from cracking it is known to provide a material with a coefficient of thermal expansion equal to or slightly higher than that of the chip between the chip and the carrier, whereby a temperature compensating surface is created between the chip and the carrier.

Theoretically, the ideal condition is using a material with a coefficient of thermal expansion equal to that of the chip but it is more convenient to use a material with a slightly greater coefficient of thermal expansion than that of the chip. The chip can, however, take compression but not expansion. The resulting coefficient of thermal expansion in the bedding can therefore not be less than the coefficient of thermal expansion of the chip since, in that case, the bedding of the chip will not expand as much as the chip as the temperature varies, whereby the chip is expanded.

The chip is mounted on the bedding at high temperature in connection with the chip being affixed to the bedding, e.g. by soldering or gluing, the chip and the bedding being, at this temperature, tensionless in relation to each other. During cooling the bedding contracts more than the chip since the bedding has a somewhat larger coefficient of thermal expansion than the chip, the bedding causing the chip to be compressed so that the chip is in a compressed condition at normal room temperature. This leads to the chip not being expanded when the temperature rises and the bedding thereby expanding more than the chip since the chip already is in its compressed condition from the start.

Chips made from GaAs (Galium Arsenide), i.e. GaAs-chips, are very brittle and thereby considerably more sensitive to thermal expansions in the bedding than chips e.g. from silicon (Si-chips). GaAs-chips are mostly used in high-frequency systems, the electronics of which working at frequencies greater than 1 Ghz.

According to prior art, the temperature compensating surface may be created by plating of e.g. copper on both sides of either a molybdenum plate or a tungsten plate, the compounds molybdenum and tungsten having a low coefficient of thermal expansion (between 4 and 5 ppm/° C.), whereby the compounds expand very little as the temperature varies.

The formed Cu—Mo—Cu-module or Cu—Wo—Cu-module has a resulting coefficient of thermal expansion of e.g. 6.5 ppm/° C., which is close to the coefficient of thermal expansion of the GaAs-chip. One copper side of the formed module is soldered or glued onto the carrier and the chip is soldered or glued onto the other copper side of the unit. The Cu—Mo—Cu-module and the Cu—Wo—Cu-module constitute fixed separate units.

A drawback of the method described above is that the Cu—Mo—Cu-module and the Cu—Wo—Cu-module constitute fixed separate units which renders pattern etching below the chip more difficult.

It is also known to mount chips directly onto a bedding made as a module, also called composite, of aluminium-silicon-carbide, an AlSiC-module, having a resulting coefficient of thermal expansion on the upper side which is close to the coefficient of thermal expansion of the chip. When the chip is a GaAs-chip, a composite of e.g. AlSiC with a coefficient of thermal expansion of e.g. 6.5 ppm/° C. on the upper side is used.

Another method according to prior art is to make the entire carrier from a molybdenum plate or tungsten plate, copper-plated on both sides, the resulting coefficient of thermal expansion for the carrier being similar to the coefficient of thermal expansion of the GaAs-chip. The chip is soldered or glued onto one of the copper sides of the carrier. A drawback of this method is that tungsten and molybdenum are expensive to use.

The Patent JP 6 061 358 discloses use of PFA-material as a dielectric for isolation between electrically conducting layers in a printed board.

The U.S. Pat. No. 5,172,301 discloses a method where moulded nobbies of a cooling body are placed in intended recesses, hollowed out of a printed board. A unit is placed above the recesses on the opposite side of the cooling body 314b, the nobbies 314b leading away the heat generated in the unit 314 down the cooling body 314.

DESCRIPTION OF THE INVENTION

One problem addressed by the invention is providing a simple, low cost temperature compensating bedding for a chip on a printed board and providing a simple, low cost method for manufacturing the temperature compensating bedding.

Another problem is providing a compact solution so that the chip on the temperature compensating bedding takes up little space on the printed board.

One object of the present invention is thus to provide a simple, low cost temperature compensating bedding in a printed board for a chip and to provide a simple, low cost method for manufacturing the temperature compensating bedding, the system comprising the chip on the temperature compensating bedding in the printed board being compact.

To accomplish this the present invention makes use of a temperature compensating means fully or partly inset in the carrier below the chip. The invention also uses e.g. a PFA-layer, both as isolating material and laminating material between the metal layers of the printed board.

More specifically the method comprises the temperature compensating means being fully or partly inset in the carrier. A dielectric layer is attached by an adhesive layer to the temperature compensating means, and the dielectric layer is plated with a pattern layer of a suitable metal, e.g. copper.

The adhesive layer may, for example, be a PFA-layer. The PFA-layer may also be directly used as dielectric layer, the PFA-substance thus being used both as dielectric layer and adhesive layer.

Conductors are etched out of the pattern layer and the chip is connected to the conductors so that the chip is placed on top of the temperature compensating means. The dielectric layer, is according to the invention, thin in relation to the other layers, the coefficient of thermal expansion of the dielectric layer not significantly influencing the resulting coefficient of thermal expansion of the temperature compensating means.

The temperature compensating means comprises a metal piece, of e.g. tungsten or molybdenum, inset in the carrier below the chip, the upper side of the metal piece being flush with the upper side of the carrier. A metal layer, e.g. copper, is fixed with a layer of glue to the upper side of the carrier and the upper side of the metal piece.

The thickness of the metal layer and the metal piece is designed such that the resulting coefficient of thermal expansion is equal to or slightly larger than the coefficient of thermal expansion of the chip at an upper side of the metal layer, said upper side being placed straight under the chip. This upper side is closest to the chip. As the resulting coefficient of thermal expansion at the upper side of the metal layer is adjacent to the coefficient of thermal expansion of the chip, the chip and the means expand almost equally as the temperature varies, whereby the chip does not crack.

Alternatively the temperature compensating means may comprise a module, e.g. a Cu—Wo—Cu-module as described above, or a Cu—Mo—Cu-module as described above, or an AlSiC-module as described above. The module is inset in the carrier below the chip, the upper side of the module being flush with the upper side of the carrier.

One advantage of the present invention is that the temperature compensating means is fully or partly inset in the carrier, the printed board thus being compact.

Another advantage of the invention is that manufacturing of the temperature compensating means is simple and low cost as only a small piece of metal is inset in the carrier.

Another advantage is that the manufacturing time for the object according to the invention is short as well-known techniques and materials are used which are easily accessible on the market.

Yet another advantage is that PFA-layers are used directly between the metal layers in the printed board, resulting in thin layers in the printed board as well as good adherence between the layers.

Another advantage of the invention is that it is possible, when using an inset module in the carrier, to etch the pattern layer under the chip without short-circuiting the underlying module.

Yet another advantage is that the temperature compensating means may be placed anywhere in the printed board carrier where it is desirable to place the chip.

The invention will now be further described by means of preferred embodiments and with reference to the annexed drawings.

PREFERRED EMBODIMENTS

The embodiments below will disclose the invention with reference to FIGS. 1–3.

Figure 1:
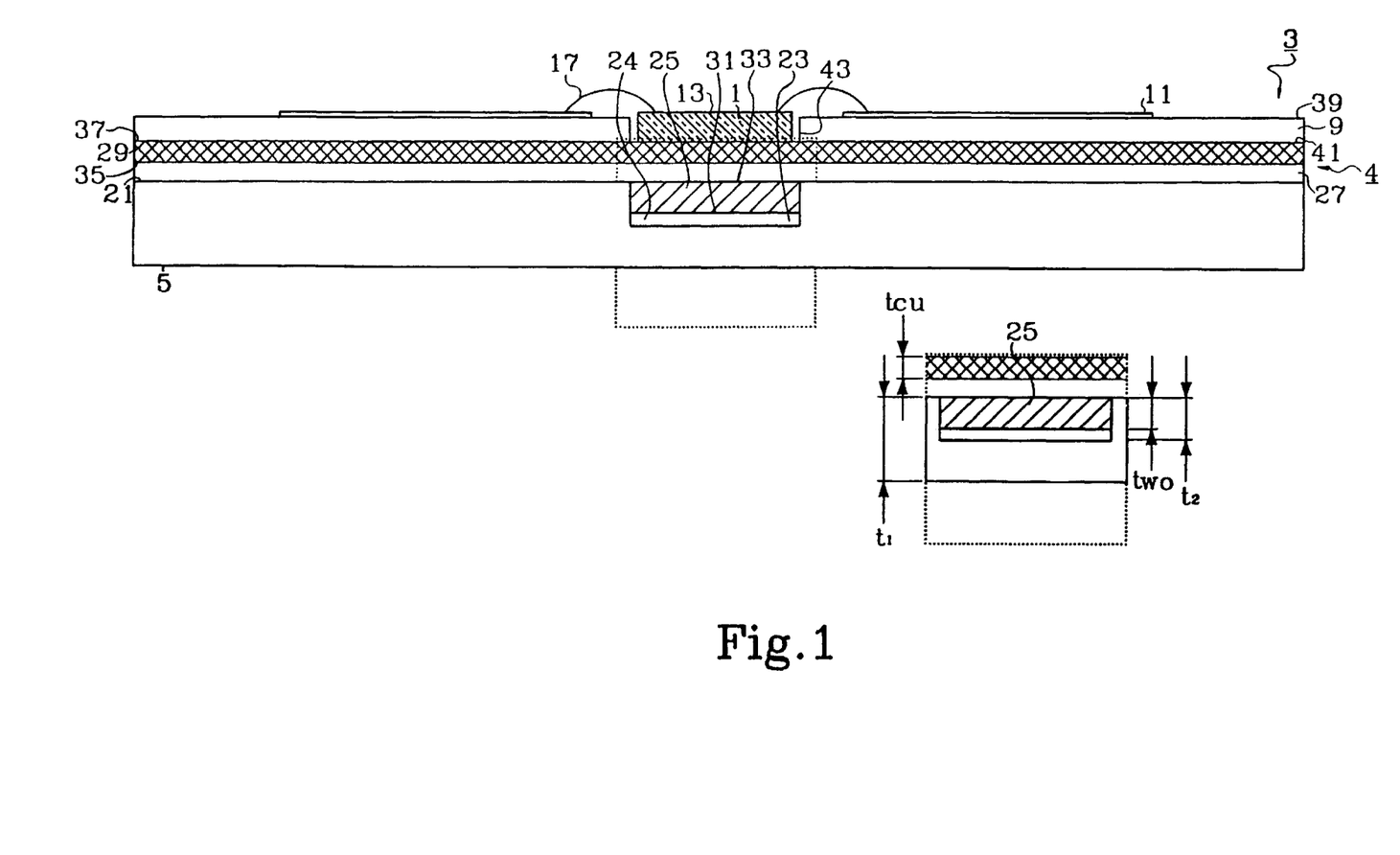
FIG. 1 shows a schematic section of a chip connected to a printed board comprising a temperature compensating means according to the invention.
Figure 2:
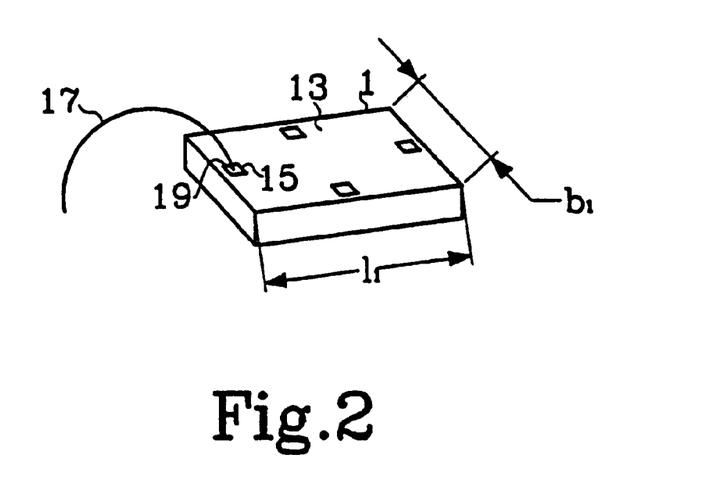
FIG. 2 shows a schematic perspective top view of the chip.

FIG. 1 shows a chip 1 on a printed board 3. The printed board 3 comprises a carrier 5, a temperature compensating means 4, a dielectric layer 9 and a pattern layer 11.

The chip 1 has a length $l_1$, a width $b_1$ and an upper surface 13. The chip 1 comprises four bonding surfaces 15, called bond pads, said bonding surfaces 15 being placed on the upper surface 13 of the chip as shown in FIG. 2.

The number of bonding surfaces 15 is not limited to four but can be more or less. The Figure shows an example of the position of the bonding surfaces 15 on the upper surface 13 of the chip, the bonding surfaces 15 being symmetrically placed around the chip center.

Wires 17 of e.g. aluminium, i.e. bond wires, are attached at a first end 19 to the bonding surface 15 of the chip by soldering, and the wires 17 are attached at a second end opposite to the first end 19, to a conductor of a printed board, the chip 1 being connected via the wire 17 to the other components of the printed board. One wire 17 only is shown in FIG. 2.

The bottom layer of the printed board 3 constitutes the carrier 5, said carrier 5 being made from a suitable substance, e.g. brass or FR4 epoxy glass. The carrier 5 has a thickness $t_1$, a bottom surface and an upper surface 21. The carrier 5 comprises a recess 23 in the upper surface 21, said recess 23 having a depth $t_2$ being less than the thickness $t_1$ of the carrier, as shown in FIG. 1.

The temperature compensating means 4 comprises a metal piece 25, a thin PFA adhesive layer 27 and a copper layer 29.

The metal piece 25 is placed in the recess 23, a bottom surface 31 of the metal piece 25 being attached by a thin adhesive substance 24, e.g. PFA (PerFluoroAlcoxy), to the recess 23. An upper surface 33 of the metal piece 25 opposite to the bottom surface 31 of the metal piece is flush with the upper surface 21 of the carrier, as shown in the Figure.

The different layers of the printed board 3 have been enlarged for clarity as have the other Figures.

Since the metal piece 25 is completely inset in the carrier 5, the invention produces a compact temperature compensating means 4 in the printed board 3.

The metal piece 25 is made of e.g. tungsten or molybdenum and has a thickness $t_{wo}$, the length of the metal piece being equal to the length of the recess 23, the width of the metal piece being equal to the width of the recess 23, the length of the metal piece being larger than or equal to the length $l_1$ of the chip and the width of the metal piece being larger than or equal to the width $b_1$ of the chip.

The copper layer 29 has a thickness $t_{cu}$, and a bottom surface 35 of the copper layer is attached by the adhesive layer 27 to the upper surface 21 of the carrier and the upper surface 33 of the metal piece.

The dielectric layer 9 is plated on an upper surface 39 with the pattern layer 11, the pattern layer 11 being made from an electrically conducting material, e.g. copper. The dielectric layer 9 is placed with a bottom surface 41, opposite to the upper surface 39 of the dielectric layer, towards the upper surface 37 of the copper layer, opposite to the bottom surface 35 of the copper layer, as shown in the Figure.

An adhesive layer is used to attach the dielectric layer 9 to the copper layer 29. For example, a layer of PFA is used as an adhesive layer. The dielectric layer 9 can also be made from PFA material, the PFA material being used both as dielectric layer 9 and adhesive layer.

When necessary, several dielectric layers plated with pattern layers can be placed on the pattern layer 11 described above, giving several layers in the printed board 3. In the following example the use of only one pattern layer 11 is described for a clearer illustration of the invention.

A chip recess 43 is arranged in the dielectric layer 9, the bottom of the chip recess comprising a part of the copper layer 29, as shown in the Figure. The chip recess 43 is placed on top of the metal piece 25, and the length of the chip recess 43 is greater than or equal to the length $l_1$ of the chip, and the width of the chip recess 43 is greater than or equal to the width $b_1$ of the chip.

Figure 3:
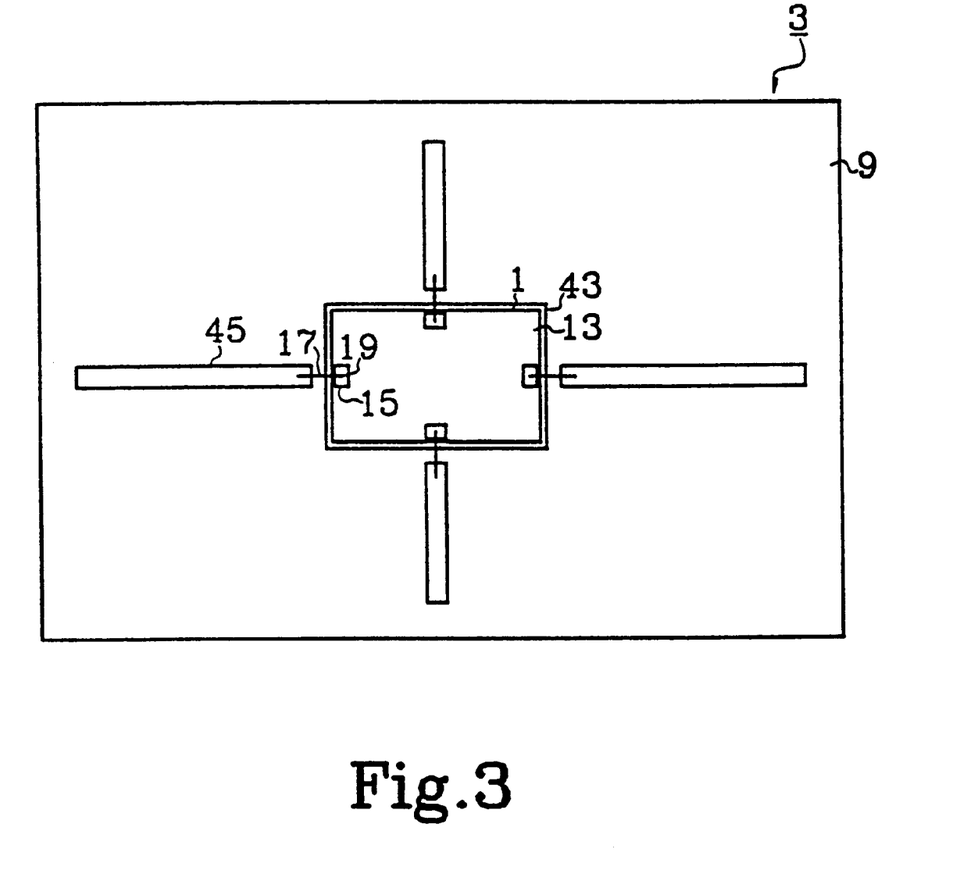
FIG. 3 shows a schematic top view of the chip and the printed board of FIG. 1.

The pattern layer 11 comprises etched conductors 45, as shown in FIG. 3, said conductors 45 not being in contact with the chip recess 43.

The chip 1 is placed in the chip recess 43 above the metal piece 25, the bottom surface of the chip being attached to the copper layer 29 by for instance gluing or soldering, se FIG. 1.

In this manner the chip 1 is arranged adjoining the upper surface 37 of the copper layer constituting the upper surface of the temperature compensating means.

Wires 17 are attached at the first end 19 to the bonding surfaces 15 of the chip, as described above, and their second ends are attached to the conductors 45 on the pattern layer 11, shown in FIG. 3. FIG. 3 shows a top view of the chip 1 placed in the chip recess 43 and connected to the conductors 45 via the wires 17.

FIG. 3 shows an example of the location of the conductors 17 on the printed board 3, the conductors 17 being symmetrically located around the center of the chip 1. The number of conductors 17 is not limited to the number shown in the Figure.

The coefficient of thermal expansion at the upper surface 37 of the copper layer is a resultant of the coefficient of thermal expansion of the copper layer 29, the coefficient of thermal expansion of the adhesive layer 27 and the coefficient of thermal expansion of the metal piece 25. The thickness $t_{cu}$ of the copper layer and the thickness $t_{wo}$ of the metal piece are so designed that the resulting coefficient of thermal expansion at the upper surface 37 of the copper layer is equal to or slightly greater than the coefficient of thermal expansion of the chip 1.

An example of the thickness $t_{cu}$ of the copper layer and the thickness $t_{wo}$ of the metal piece, when the chip 1 is a GaAs-chip and the metal piece 25 is a tungsten piece, is given below. According to the invention the adhesive layer 27 is thin in relation to the copper layer 29 and the metal piece 25, whereby the adhesive layer 27 does not significantly influence the resulting coefficient of thermal expansion of the temperature compensating means 4. The thickness of the adhesive layer is for instance 12 $\mu$m.

The thin adhesive layer 27 does not significantly influence the thermal expansions of the temperature compensating means 4 but these expansions are controlled by the thicker layers, in this example constituting the copper layer 29 and the metal piece 25.

If the thickness $t_{cu}$ of the copper layer is designed as 70 $\mu$m and the thickness $t_{wo}$ of the metal piece as 500 $\mu$m, a resulting coefficient of thermal expansion is achieved at about 6.5 ppm/° C. (parts per million per degree Celsius) at the upper surface 37 of the copper layer. The GaAs-chip has a coefficient of length expansion of about 5.6–5.9 ppm/° C.

Figure 5:
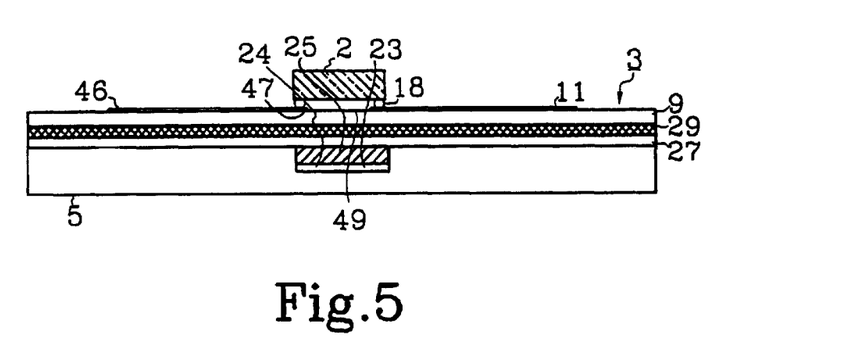
FIG. 5 shows a schematic section of the flip-chip on the temperature compensating means on the printed board according to the invention.
Figure 6:
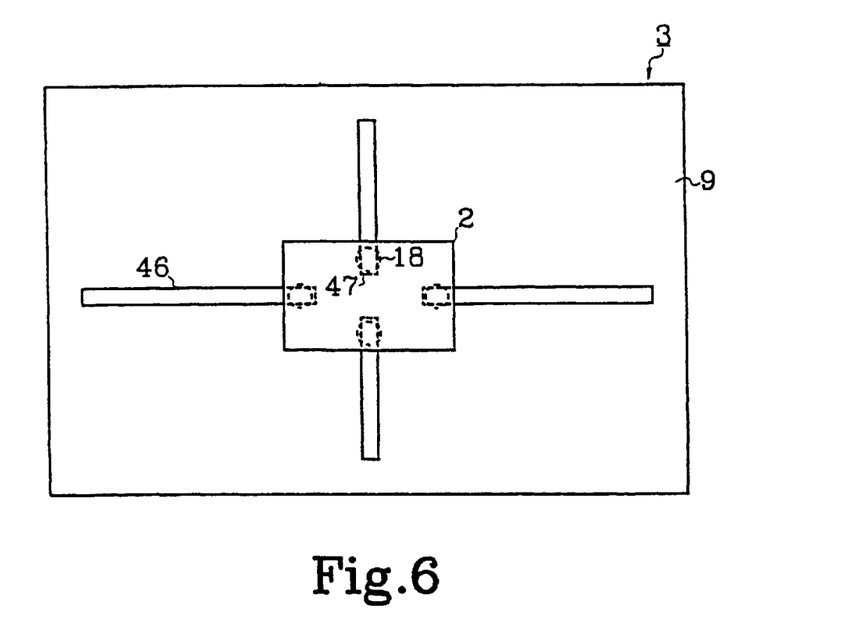
FIG. 6 shows a schematic top view of the flip-chip and the printed board of FIG. 5.

An alternative embodiment of the invention relating to the previous example is described below, referring to FIGS. 4–6, wherein the chip being used is a flip-chip 2.

Flip-chips are chips that can be placed onto conductors in printed boards, which makes etching possible under the flip-chip. The flip-chip comprises elevations, i.e. bonding units, on a bottom surface, said bonding units being attached to conductors to connect the flip-chip to the printed board.

Figure 4:
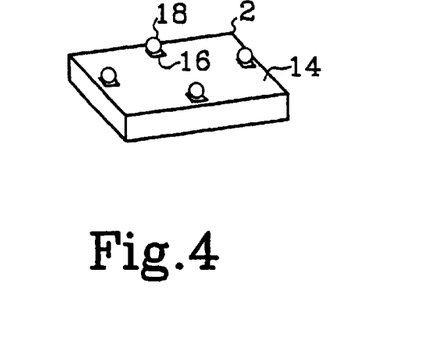
FIG. 4 shows a schematic perspective bottom view of a flip-chip.

FIG. 4 shows the flip-chip 2 comprising a bottom surface 14, an upper surface, and four bonding surfaces 16. The bonding surfaces 16 are placed on the bottom surface 14 of the flip-chip and a bonding unit 18 is fixed to each bonding surface 16.

In the same way as in the previous example, the metal piece 25 is mounted into the recess 23 in the carrier 5 by a thin the upper surface 21 of the carrier and the upper surface 33 of the metal piece by a thin PFA adhesive layer 27, as described above and shown in FIG. 5. The layers are enlarged in the Figure to illustrate the invention more clearly.

The dielectric layer 9 is plated with a pattern layer 11 and attached to the copper layer 29, as described above. PFA is, for example, used as dielectric. The dielectric layer 9 according to the invention is thin in relation to the copper layer 29 and the metal piece 25, whereby the coefficient of thermal expansion of the dielectric layer does not significantly influence the resulting coefficient of thermal expansion at the upper surface 37 of the copper layer.

Conductors 46 are etched from the pattern layer 11, said conductors 46 comprising a first end 47.

A chip bonding area 49 in the pattern layer 11 is placed over the metal piece 25, which is described in more detail below.

The chip bonding area 49 is as wide as the width of the flip-chip 2, and the length of the chip bonding area 49 is equal to the length of the flip-chip 2.

The first end 47 of the conductors is placed within the chip bonding area 49, and the flip-chip 2 is mounted over the chip bonding area 49 with the bonding units 18 onto the first ends 47 of the conductors. Se also FIG. 6, showing a top view of the flip-chip 2 mounted with the bonding units 18 on the conductors 46.

Figure 7:
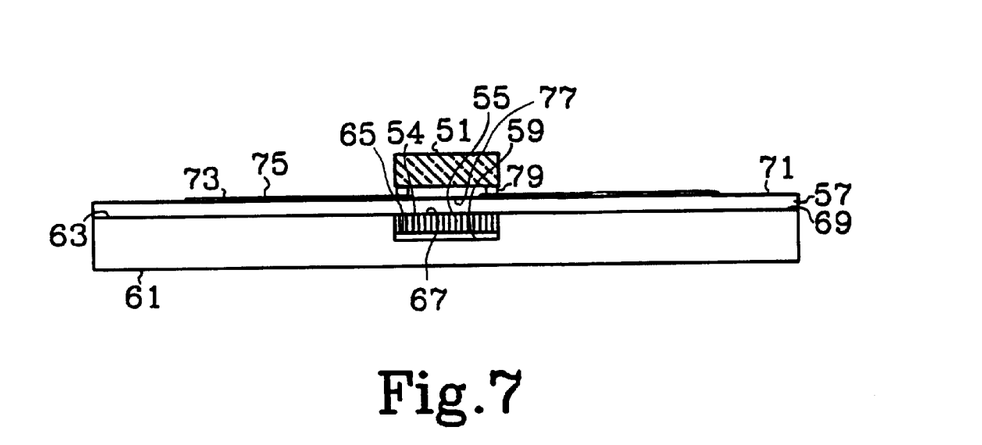
FIG. 7 shows a schematic section of the flip-chip on an alternative temperature compensating means on the printed board according to the invention.

FIG. 7 shows an alternative embodiment of the temperature compensating means according to the invention, the chip used being a flip-chip 51. The embodiment discloses an example where no metal layers, i.e. ground layers, are placed between the flip-chip 51 and a carrier 61.

The temperature compensating means comprises according to this embodiment a module 55 and a thin dielectric layer 57.

The module 55 is, for example, a copper-molybdenum-copper module, Cu—Mo—Cu-module, or a copper-tungsten-copper module, Cu—Wo—Cu-module, or an aluminium-silicon-carbide module, AlSiC-module, which have been described in more detail here above.

The module 55 is completely inset in a recess 59 in the carrier 61, the carrier 6, for example, being brass or FR4 glass epoxy, a bottom surface 65 of the module 55 being mounted by an adhesive layer 54 to the recess 59, and an upper surface 67 of the module 55, opposite to the bottom surface 65 of the module being flush with an upper surface 63 of the carrier 61.

The coefficient of thermal expansion at the upper surface 67 of the module is equal to or slightly greater than the coefficient of thermal expansion of the flip-chip 51.

The length of the module 55 is equal to the length of the recess 59, the width of the module 55 is equal to the width of the recess 59, the length of the module 55 is greater than or equal to the length of the flip-chip 51, and the width of the module 55 is greater than or equal to the width of the flip-chip 51.

The dielectric layer 57 is attached with a bottom surface 69 against the upper surface 63 of the carrier and the upper surface 67 of the module, and the dielectric layer 57 is plated on an upper surface 71, opposite to the bottom surface 69 of the dielectric layer, with a pattern layer 73, as shown in the Figure.

The dielectric layer 57 is attached to the carrier 61 and the module 55 by an adhesive layer, e.g. a PFA layer. PFA can also be used as a dielectric, whereby the PFA substance is used both as dielectric layer and adhesive layer. The dielectric layer 57 according to the invention is thin in relation to the layers of the module, whereby the coefficient of thermal expansion of the dielectric layer does not significantly influence the coefficient of thermal expansion at the upper surface 67 of the module.

Conductors 75 are etched from the pattern layer 73, whereby a first end of the conductors 75 is placed within a chin bonding area 77 of the flip-chip 51. The chip bonding area 77 is an area of the pattern layer 73 which is placed on top of the module 55.

The chip bonding area 77 is as wide as the width of the flip-chip 51, and the length of the chip bonding area 77 is equal to the length of the flip-chip 51. The flip-chip 51, as described above, is mounted with bonding units 79 onto first ends of the conductors 75 in the pattern layer 73, as shown in the Figure.

It can be realized from the above described examples that even the entire carrier 61 can be made as an AlSiC-module. In that case the above mentioned module 55 is not needed since the resulting coefficient of thermal expansion at the upper surface 63 of the carrier, right under the flip-chip 51, is equal to or slightly greater than the coefficient of thermal expansion of the flip-chip 51 when the dielectric layer 57 according to the invention is thin. The coefficient of thermal expansion of the dielectric layer does thereby not significantly influence the coefficient of thermal expansion at the upper surface 63 of the carrier.

Figure 8:
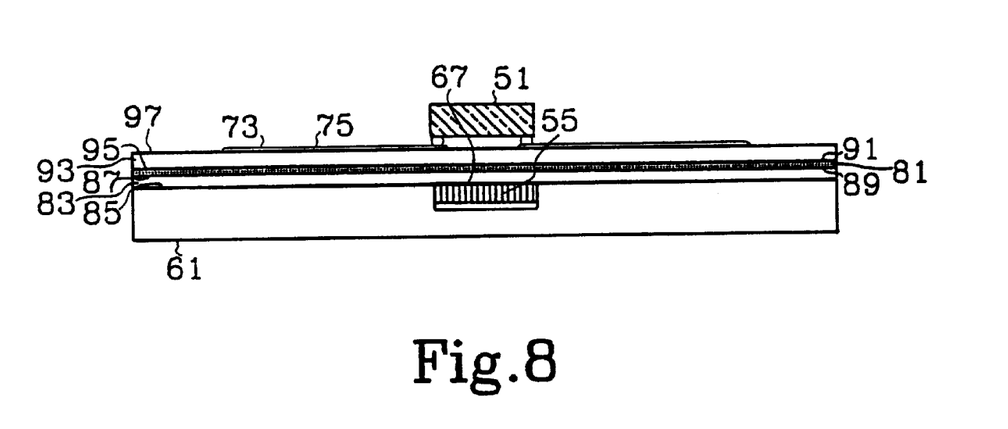
FIG. 8 shows the flip-chip and the printed board of FIG. 7, a ground layer being integrated in the printed board according to the invention.

FIG. 8 shows an alternative embodiment of the previous example, a ground layer 81 being placed between the pattern layer 73 and the carrier 61 according to the previous example.

The module 55 is completely inset in the carrier 61, whereby the upper surface 67 of the module is flush with the upper surface 63 of the carrier, as described in the previous example.

A first layer 83 of dielectric is attached with a bottom surface 85 onto the upper surface 63 of the carrier and the upper surface 67 of the module.

The ground layer 81 is attached with a bottom surface 89 against an upper surface 87 of the first dielectric layer, opposite to the bottom surface 85 of the first dielectric layer.

A bottom surface 95 of a second dielectric layer 93 is attached to an upper surface 91 of the ground layer 81. The upper surface 91 of the ground layer is opposite to the bottom surface 89 of the ground layer. The second dielectric layer 93 is plated on an upper surface 97, opposite the bottom surface 95 of the second dielectric layer, with the pattern layer 73.

The first dielectric layer 83 and the second dielectric layer 93 are attached to the carrier 61 and the module 55 and the ground layer 81, respectively, by an adhesive layer, e.g. a PFA layer. PFA can also be used as a dielectric, whereby the PFA substance is used both as dielectric layer and adhesive layer.

Conductors 75 are etched from the pattern layer 73 in the same way as described according to the previous example, whereby the bonding units 79 of the flip-chip 51 are mounted onto the first ends of the conductors 75 over the module 55.

The first dielectric layer 83, the ground layer 81 and the second dielectric layer 93 are according to the invention thin in relation to the layers of the module, whereby the respective coefficients of thermal expansion do not significantly influence the coefficient of thermal expansion at the upper surface 67 of the module.

In the following example a method is described according to the invention for manufacturing a temperature compensating means 4 for the chip 1, according to the above described example, with reference to FIGS. 9–15. The chip 1 can, for example, be a GaAs-chip (GaliumArsenide chip).

Figure 9:
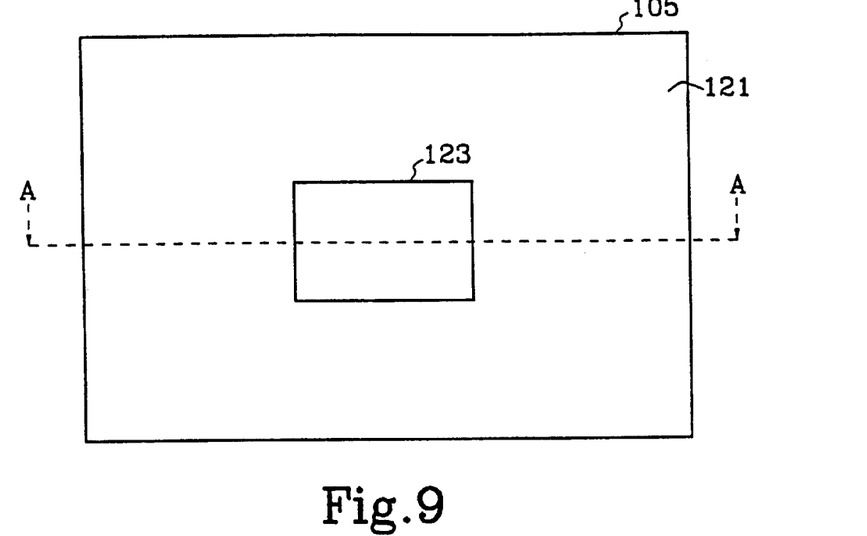
FIG. 9 shows a schematic top view of a carrier comprising a recess according to the invention.

A carrier 105 is shown from above in FIG. 9, the carrier 105 being made from a suitable substance, e.g. brass or FR4 epoxy glass. The carrier 105 has a thickness $t_1$ and an upper surface 121.

Figure 10:
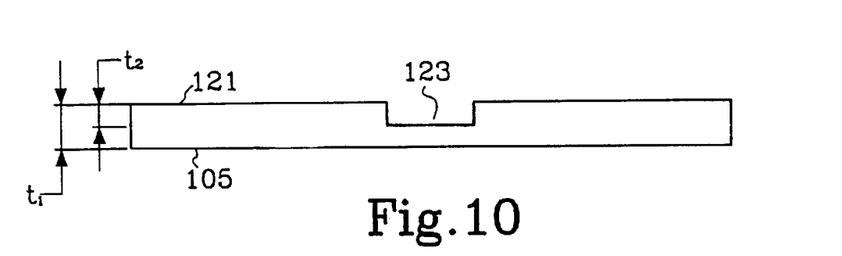
FIG. 10 shows a section A—A through the carrier of FIG. 9.

The first step of the method is milling a recess 123 in the upper surface 121 of the carrier, said recess 123 having a depth $t_2$ which is less than the thickness $t_1$ of the carrier, as shown in FIG. 10. FIG. 10 shows a section A—A of FIG. 9, and FIG. 10 shows a side view of the carrier 105 comprising the milled recess 123.

The length of the recess 123 is greater than or equal to the length $l_1$ of the chip, and the width of the recess 123 is greater than or equal to the width $b_1$ of the chip.

Figure 11:
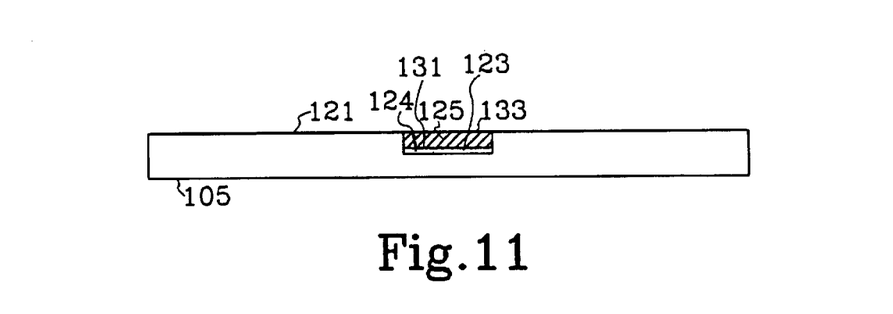
FIG. 11 shows the section A—A through the carrier of FIG. 9, a metal piece being placed in the recess according to the invention.

After milling the recess 123, the next manufacturing step is placing a metal piece 125 comprising a bottom surface 131 and an upper surface 133 into the recess 123, as shown in FIG. 11. The metal piece 125 is attached with its bottom surface 131 against the recess 123 by a thin adhesive layer 124, e.g. PFA (PerFluoroAlcoxy). The upper surface 133 of the metal piece is flush with the carrier upper surface 121, as shown in the Figure. The Figure has been enlarged for a clearer view of the invention.

The metal piece 125 may, for example, be made from tungsten or molybdenum. The length of the metal piece 125 is equal to the length of the recess 123, and the width of the metal piece 125 is equal to the width of the recess 123.

Figure 12:
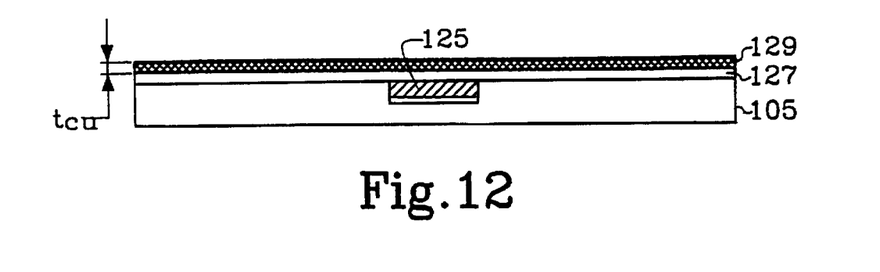
FIG. 12 shows the section A—A through the carrier of FIG. 9, a copper layer being attached by an adhesive layer to the carrier and the metal piece according to the invention.

The third step of the manufacturing process is placing a layer of copper 129 on the upper surface 121 of the carrier and the upper surface 133 of the metal piece. The copper layer 129 has a thickness $t_{cu}$ and is attached to the carrier 105 and the metal piece 125 by a thin PFA adhesive layer 127, as shown in FIG. 12.

Subsequently, a dielectric layer 109 is placed over the copper layer 129, see FIG. 13, said dielectric layer 109 being plated with a pattern layer 111 of a suitable electrically conducting material, e.g. copper.

Figure 14:
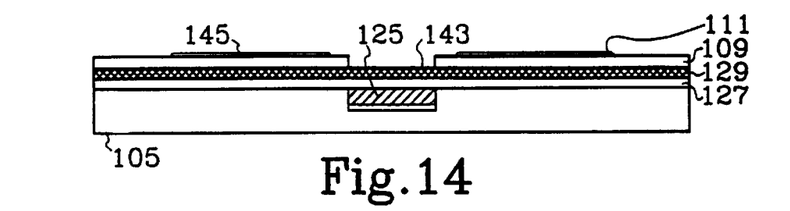
FIG. 14 shows the section A—A through the carrier of FIG. 9, the plated dielectric layer comprising a chip recess according to the invention.

The next step of the manufacturing process is milling a chip recess 143 in the dielectric layer 109, as shown in FIG. 14.

After this, a pattern is etched in the pattern layer 111, said pattern comprising conductors 145, as shown in FIG. 14.

Figure 15:
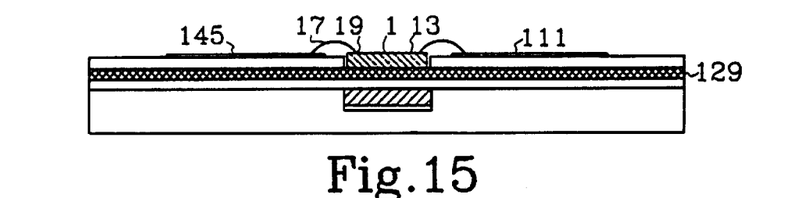
FIG. 15 shows the section A—A through the carrier of FIG. 9, a chip being placed in the chip recess according to the invention.

During the next step of the manufacturing process the chip 1 is placed in a chip recess 143 above the metal piece 125, the bottom surface of the chip 1 being attached to the copper layer 129 by, e.g., gluing or soldering, see FIG. 15.

Wires 17 are attached by the first end 19 to the chip bonding surfaces 15, and the second ends of the wires are attached to the conductors 145 etched from the pattern layer 111.

Figure 16:
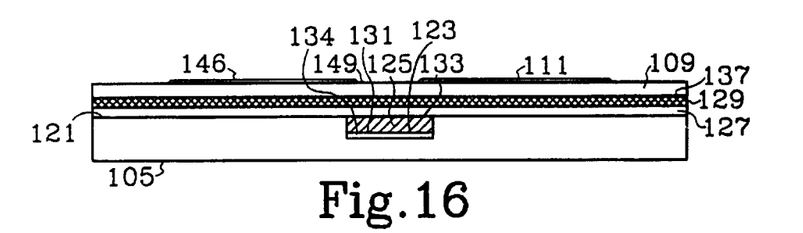
FIG. 16 shows a schematic section through the printed board comprising the temperature compensating means according to the invention.
Figure 17:
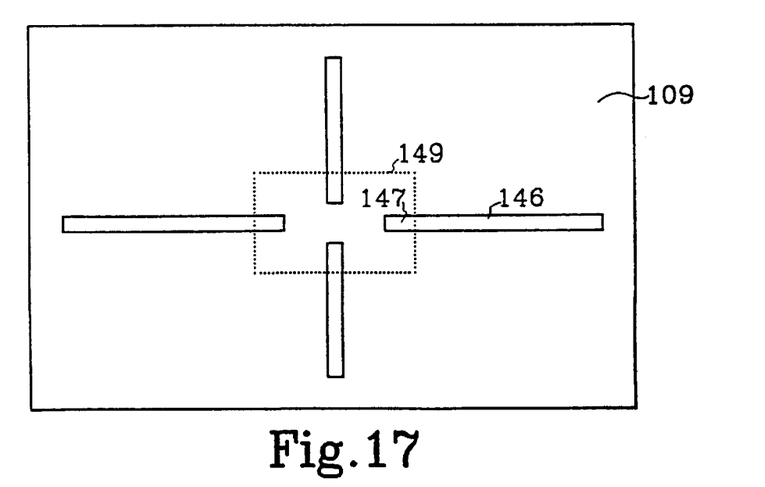
FIG. 17 shows a schematic top view of the printed board of FIG. 16.
Figure 18:
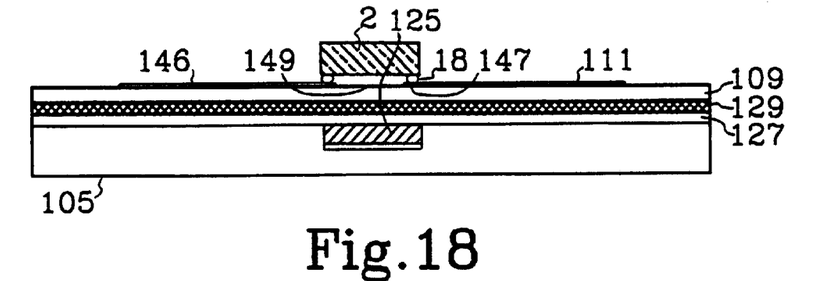
FIG. 18 shows a schematic section through the flip-chip on the temperature compensating means on the printed board according to the invention.

The following example discloses a method according to the invention for making a temperature compensating means 4 for a flip-chip 2, referring to the previous example and FIGS. 16–18, which have been enlarged for a clearer view of the invention. The flip-chip 2 has been described in more detail above.

In the same way as in the previous example the metal piece 125 is placed in the recess 123 milled in the carrier 105, and the bottom surface 131 of the metal piece is attached to the recess 123 by a thin adhesive layer 134. The copper layer 129 is attached to the upper surface 121 of the carrier and the upper surface 133 of the metal piece by a thin PFA adhesive layer 127, as described above with reference to FIG. 12.

Figure 13:
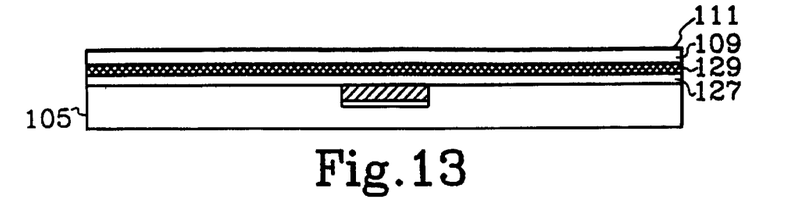
FIG. 13 shows the section A—A through the carrier of FIG. 9, a plated dielectric layer being placed on the copper layer according to the invention.

After this, as in the previous example, the dielectric layer 109 is placed over the copper layer 129, see FIG. 13, said dielectric layer 109 being plated with a pattern layer 111, as described above.

The dielectric layer 109 according to the invention is thin in relation to the copper layer 129 and the metal piece 125, whereby the coefficient of thermal expansion of the dielectric layer 109 does not significantly influence the resulting coefficient of thermal expansion at the upper surface 137 of the copper layer, said upper surface 137 adjoining the dielectric layer 109.

The next step of the manufacturing process is etching a pattern from the pattern layer 111, said pattern comprising conductors 146, as shown in FIG. 16.

A top view of FIG. 16 is shown in FIG. 17, the etched conductors 146 being indicated in FIG. 17. A chip bonding area 149 is etched from the pattern layer 111, as shown in FIG. 17. The chip bonding area 149 is an area of the pattern layer 111 which is placed over the metal piece 125. A first end 147 of the conductors 146 is placed within the chip bonding area 149, as shown in the Figure.

The flip-chip 2 is subsequently placed over the chip bonding area 149, and the bonding units 18 of the flip-chip are mounted to the first ends 147 of the conductors, as shown in FIG. 18.

An alternative embodiment according to the invention for making a temperature compensating means for a flip-chip 51 is described in the following example.

Figure 19:
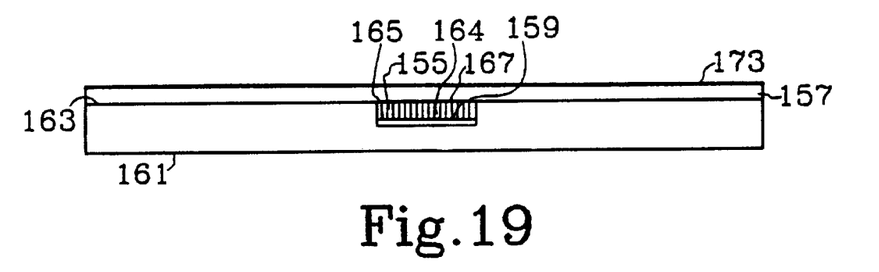
FIG. 19 shows a schematic section through an alternative temperature compensating means on the printed board according to the invention.

A module 155 is placed in a milled recess 159 in a carrier 161, as shown in FIG. 19, said module 155 comprising a bottom surface 165 and an upper surface 167. The module 155, for example, being a copper-molybdenum-copper module, Cu—Mo—Cu-module, or a copper-tungsten-copper module, Cu—Wo—Cu-module, or an aluminium-silicon-carbide module, AlSiC-module, said modules having been described earlier.

The module 155 is attached with its bottom surface 165 to the recess 159 by a thin adhesive layer 164, e.g. PFA (PerFluoroAlcoxy). The upper surface 167 of the module is flush with an upper surface 163 of the carrier 161, as shown in the Figure.

The length of the module 155 is equal to the length of the recess 159, and the width of the module 155 is equal to the width of the recess 159. Furthermore, the length of the module 155 is greater than or equal to the length of the flip-chip 51, and the width of the module 155 is greater than or equal to the width of the flip-chip 51.

A dielectric layer 157, e.g. PFA, is subsequently placed on an upper surface 163 of the carrier and the upper surface 167 of the module. The dielectric layer 157 according to the invention is thin in relation to the layers of the module, whereby the coefficient of thermal expansion of the dielectric layer 157 does not significantly influence the coefficient of thermal expansion at the upper surface 167 of the module. The dielectric layer 157 is plated with a pattern layer 173 of a suitable electrically conducting material, e.g. copper, as shown in the Figure.

Figure 20:
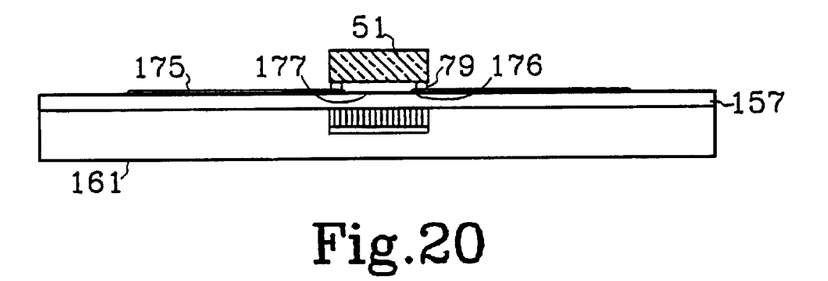
FIG. 20 shows a schematic section through the flip-chip of the alternative temperature compensating means on the printed board according to the invention.

The next step of the manufacturing process is etching a pattern from the pattern layer 173, said pattern comprising conductors 175, as shown in FIG. 20. A chip bonding area 177 is etched from the pattern layer 173.

The chip bonding area 177 is a surface part of the pattern layer 173 placed over the module 155. A first end 176 of the conductors 175 is placed within the chip bonding area 177.

The flip-chip 51 is then placed over the chip bonding area 177, and the bonding units 79 of the flip-chip are mounted to the first ends 176 of the conductors, as shown in FIG. 20.

Figure 21:
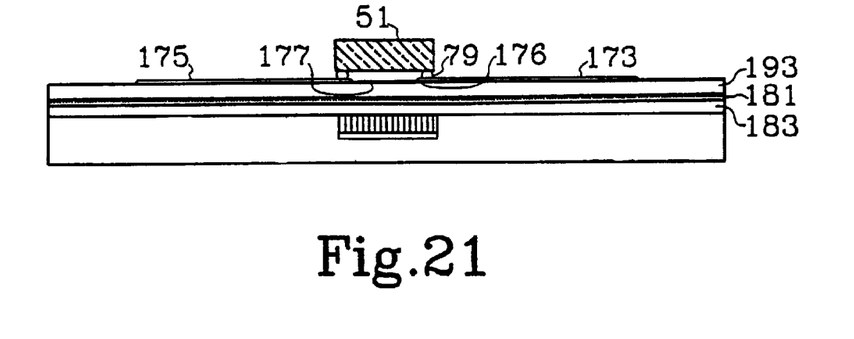
FIG. 21 shows the printed board of FIG. 20, a ground layer being integrated in the printed board according to the invention.

FIG. 21 shows an alternative embodiment of the above example, wherein a first dielectric layer 183 is placed onto the upper surface 163 of the carrier and the upper surface 167 of the module.

A ground layer 181 is subsequently placed onto the first dielectric layer 183, and a second dielectric layer 193 is placed onto the ground layer 181, as shown in the Figure.

The second dielectric layer 193 is plated with the pattern layer 173 according to the previous example, and shown in the Figure, and conductors 175 are etched from the pattern layer 173. Furthermore, the chip bonding area 177 is etched from the pattern layer 173, as described above.

The flip-chip 51 is subsequently placed over the chin bonding area 177, and the bonding units 79 of the flip-chip are mounted to the first ends 176, as shown in FIG. 21.

The first dielectric layer 183, the second dielectric layer 193 and the ground layer 181 according to the invention are thin in relation to the layers of the module, whereby the corresponding coefficient of thermal expansion does not significantly influence the coefficient of thermal expansion at the upper surface 167 of the module.

The dielectric layers and the adhesive layers in the examples described above are not limited to being PFA-material layers but other substances with similar electric properties as PFA can be used as well. One example is PTFE (PolyTetraFluoro-Ethylene).

I claim:

1. A temperature compensating device comprising: a circuit on a printed board, the printed board comprising a carrier and temperature compensating means being fully or partly inset into a recess in an upper surface of the carrier, a coefficient of thermal expansion at an upper surface of the temperature compensating means being equal to or slightly greater than a coefficient of thermal expansion of the circuit, the circuit being disposed adjoining the upper surface of the temperature compensating means, and the temperature compensating means being composed of at least two different substances, the coefficient of thermal expansion at the upper surface of the temperature compensating means being dependent on coefficients of thermal expansion of the different substance, wherein the temperature compensating means includes a metal unit, an adhesive layer and a ground layer, the metal unit being fully inset into said recess in the carrier, a bottom surface of the metal unit being attached to the recess, and an upper surface of the metal unit located opposite to the bottom surface of the metal unit being flush with the upper surface of the carrier, the adhesive layer being disposed onto the upper surface of the carrier and the upper surface of the metal unit, the ground layer being disposed with a bottom surface onto the adhesive layer, the adhesive layer having a thickness less than a thickness of the metal unit and less than a thickness of the ground layer, the thickness of the metal unit and the thickness of the ground layer being designed such that a coefficient of thermal expansion at an upper surface of the ground layer located opposite to the bottom surface of the ground layer is equal to or slightly greater than the coefficient of length expansion of the circuit.

2. The temperature compensating device according to claim 1, wherein the circuit is disposed over the metal unit, an area of the upper surface of the metal unit being greater than or equal to an area of a bottom surface of the circuit.

3. The temperature compensating device according to claim 2, wherein the circuit is disposed onto the upper surface of the ground layer.

4. The temperature compensating device according to claim 2, further comprising a dielectric layer disposed between the ground layer and the circuit, said dielectric layer having a thickness less than the thickness of the ground layer and less than the thickness of the metal unit.

5. The temperature compensating device according to claim 4, wherein the circuit is a flip-chip.

6. The temperature compensating device according to claim 3, wherein the metal unit is made from tungsten or molybdenum, the ground layer being a copper layer.

7. A temperature compensating device comprising: a circuit on a printed board, the printed board comprising a carrier and temperature compensating means being fully or partly inset into a recess in an upper surface of the carrier, a coefficient of thermal expansion at an upper surface of the temperature compensating means being equal to or slightly greater than a coefficient of thermal expansion of the circuit, the circuit being disposed adjoining the upper surface of the temperature compensating means, and the temperature compensating means being composed of at least two different substances, the coefficient of thermal expansion at the upper surface of the temperature compensating means being dependent on coefficients of thermal expansion of the different substance, wherein the printed board includes a layer and said temperature compensating means includes a module, said module being fully inset into said recess in the carrier a bottom surface of the module being attached to the recess and an upper surface of the module located opposite to the bottom surface of the module being flush with the upper surface of the carrier, said layer being an adhesive layer disposed onto the upper surface of the carrier and the upper surface of the module and onto an overlying layer, said adhesive layer having dielectric properties.

8. The temperature compensating device according to claim 7, wherein the circuit is disposed onto the module, an area of the upper surface of the module being greater than or equal to an area of the bottom surface of the circuit.

9. The temperature compensating device according to claim 8, wherein the circuit is a flip-chip.

10. The temperature compensating device according to claim 9, wherein the module includes at least one of a copper-tungsten-copper module, a copper-molybdenum-copper module, and an aluminum-silicon-carbide module.

11. The temperature compensating device according to claim 10, wherein the temperature compensating means includes at least one upper dielectric layer and at least one pattern layer, said one pattern layer being disposed onto said adhesive layer, said one upper dielectric layer being disposed on said pattern layer.

12. The temperature compensating means according to claim 11, wherein the upper dielectric layer and the adhesive layer include PFA layers (PerFluoro Alcoxy layers).

* * * * *